US006630714B2

United States Patent
Sato et al.

(10) Patent No.: US 6,630,714 B2
(45) Date of Patent: Oct. 7, 2003

(54) SEMICONDUCTOR DEVICE FORMED IN SEMICONDUCTOR LAYER ARRANGED ON SUBSTRATE WITH ONE OF INSULATING FILM AND CAVITY INTERPOSED BETWEEN THE SUBSTRATE AND THE SEMICONDUCTOR LAYER

(75) Inventors: Tsutomu Sato, Yokohama (JP); Hajime Nagano, Yokohama (JP); Ichiro Mizushima, Yokohama (JP); Takashi Yamada, Ebina (JP); Yuso Udo, Chofu (JP); Shinichi Nitta, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/091,448

(22) Filed: Mar. 7, 2002

(65) Prior Publication Data

US 2003/0122191 A1 Jul. 3, 2003

(30) Foreign Application Priority Data

Dec. 27, 2001 (JP) ........................ 2001-398184

(51) Int. Cl.⁷ ................ H01L 27/01; H01L 27/12; H01L 31/0392
(52) U.S. Cl. ................ 257/350; 257/347; 257/354
(58) Field of Search ................ 257/347, 350, 257/351, 353, 354

(56) References Cited

U.S. PATENT DOCUMENTS

| | | | | |
|---|---|---|---|---|
| 4,879,585 A | * | 11/1989 | Usami | 257/288 |
| 5,159,416 A | * | 10/1992 | Kudoh | 257/384 |
| 5,489,547 A | * | 2/1996 | Erdeljac et al. | 438/238 |
| 5,565,697 A | * | 10/1996 | Asakawa et al. | 257/347 |
| 5,589,695 A | * | 12/1996 | Malhi | 257/77 |
| 5,686,755 A | * | 11/1997 | Malhi | 257/492 |
| 5,894,152 A | * | 4/1999 | Jaso et al. | 257/347 |
| 6,034,399 A | * | 3/2000 | Brady et al. | 257/355 |
| 6,127,701 A | * | 10/2000 | Disney | 257/338 |
| 6,140,163 A | * | 10/2000 | Gardner et al. | 438/157 |
| 6,229,179 B1 | * | 5/2001 | Song et al. | 257/350 |
| 6,288,427 B2 | * | 9/2001 | Huang | 257/350 |
| 6,380,037 B1 | * | 4/2002 | Osanai | 438/294 |

FOREIGN PATENT DOCUMENTS

JP 11-17001 1/1999

OTHER PUBLICATIONS

Robert Hannon, et al., "0.25″m Merged Buld DRAM and SOI Logic Using Patterned SOI", 2000 Symposium on VLSI, Technology Digest of Technical Papers, (2 pages).

H.L. Ho, et al., "A 0.13μm High–Performance SOI Logic Technology with Embedded DRAM for System–On–A–Chip Application", 2001 IEDM Technical Digest, (4 pages).

* cited by examiner

Primary Examiner—Ngân V. Ngô
(74) Attorney, Agent, or Firm—Oblon, Spivak, McClelland, Maier & Neustadt, P.C.

(57) ABSTRACT

A semiconductor device according to an aspect of the present invention comprises a first semiconductor layer and a plurality of second semiconductor layers. The first semiconductor layer is formed in a first region of a semiconductor substrate with one of an insulating film and a cavity interposed between the semiconductor substrate and the first semiconductor layer. The plurality of second semiconductor layers is formed in second regions of the semiconductor substrate.

36 Claims, 4 Drawing Sheets

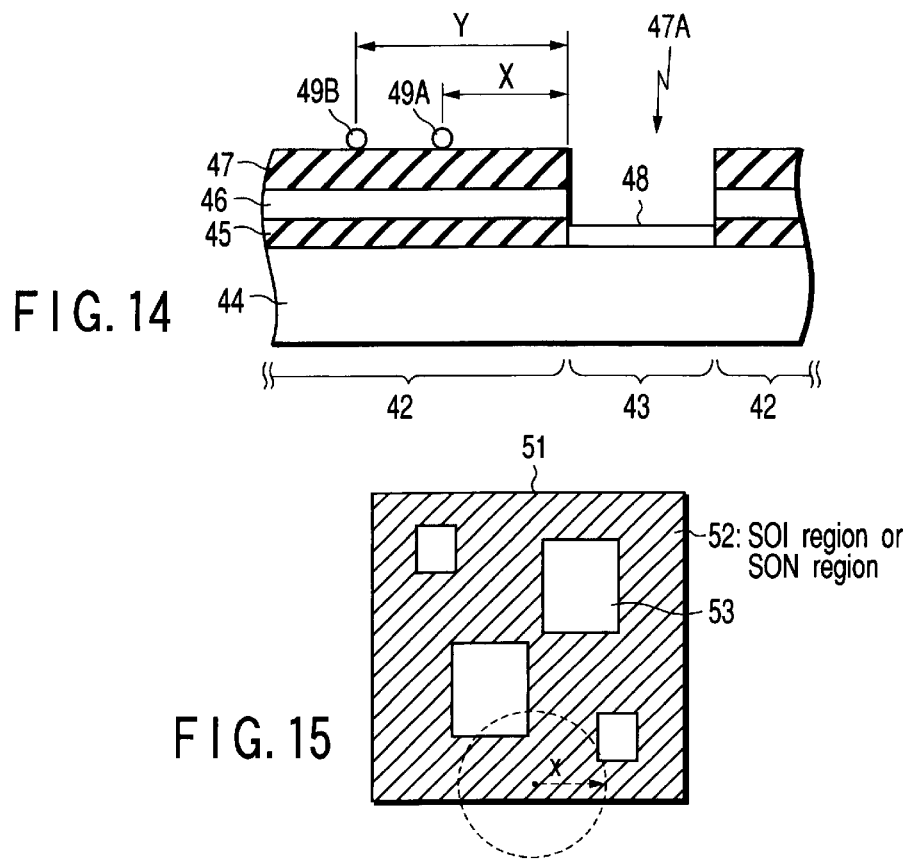
FIG. 14
FIG. 15
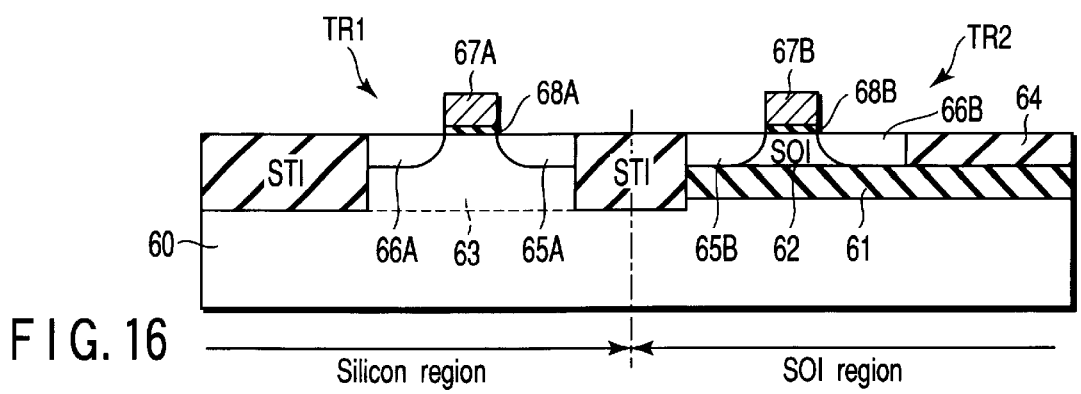
FIG. 16
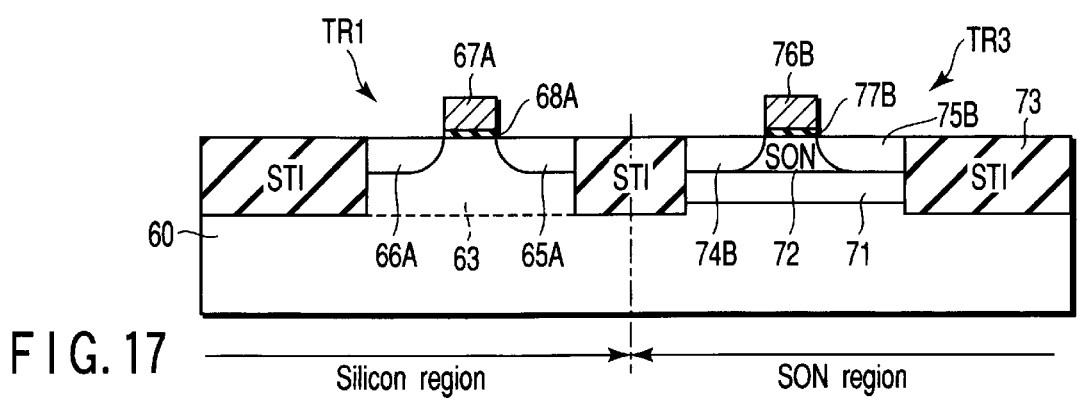
FIG. 17

SEMICONDUCTOR DEVICE FORMED IN SEMICONDUCTOR LAYER ARRANGED ON SUBSTRATE WITH ONE OF INSULATING FILM AND CAVITY INTERPOSED BETWEEN THE SUBSTRATE AND THE SEMICONDUCTOR LAYER

CROSS-REFERENCE TO RELATED APPLICATIONS

This application is based upon and claims the benefit of priority from the prior Japanese Patent Application No. 2001-398184, filed Dec. 27, 2001, the entire contents of which are incorporated herein by reference.

BACKGROUND OF THE INVENTION

1. Field of the Invention

The present invention relates to a semiconductor device having an SOI (Silicon On Insulator) structure in which a semiconductor layer is formed in a partial region of a semiconductor substrate with an insulating film interposed between the semiconductor substrate and the semiconductor layer, or an SON (Silicon On Nothing) structure in which a semiconductor layer is formed in a partial region of a semiconductor substrate with a cavity region interposed between the semiconductor substrate and the semiconductor layer.

2. Description of the Related Art

Recently, a substrate (to be referred to as an SOI substrate hereinafter) having an SOI structure is considered to be promising as a substrate capable of forming an element which can improve the operating speed and reduce the power consumption. This SOI substrate is particularly attracting attention as a substrate for a logic device required to operate at high speed. On the other hand, when a memory element such as a DRAM or an analog circuit such as a power amplifier is formed on the SOI, the element or circuit malfunctions owing to the floating effect. Accordingly, a DRAM or an analog circuit must be formed not on the SOI but on common silicon in order to stabilize the operation of the memory or circuit.

To form both a logic device and a memory device on a substrate, therefore, it is possible to use a partial SOI substrate in which a silicon region not having the SOI structure and an SOI region having the SOI structure are partially formed on a substrate beforehand. It is necessary to form a logic circuit on the SOI region in which a buried oxide film is present below silicon, and to form a DRAM and an analog circuit on the common silicon region in which no buried oxide film is present below silicon.

Unfortunately, analog elements forming the analog circuit are readily influenced by noise, so these elements are preferably electrically disconnected from the logic circuit and the memory circuit. On the partial SOI substrate, the logic circuit is formed on the SOI region and subjected to element isolation. Therefore, this logic circuit and the analog circuit are electrically disconnected. However, the DRAM and the analog circuit formed on the same silicon region are formed adjacent to each other, so noise propagation from the DRAM to the analog circuit is a problem.

Also, when an input/output circuit for exchanging signals with another semiconductor device is formed on the SOI region, high voltages are applied to elements forming this input/output circuit because the SOI region is insulated. This easily brings about electrostatic breakdown. In addition, the side surfaces of a semiconductor layer in the SOI region are covered with $SiO_2$ for element isolation, and the bottom surface of this semiconductor layer is covered with $SiO_2$ of the buried oxide film. Hence, an element formed on the SOI region has the drawback that heat generated from this element when the element is driven is not efficiently dissipated.

Furthermore, with the advancing micropatterning of elements, junctions must be made shallow. When annealing is performed to activate an impurity such as boron (B), phosphorus (P), or arsenic (As) ion-implanted into a semiconductor layer, the impurity diffuses more than necessary if the annealing time is long, and this deepens the junction. To prevent the formation of a deep junction, the semiconductor layer must be heated and cooled rapidly. A halogen lamp or the like is generally used in this heating. However, a difference between the heat absorption efficiencies between the SOI region and the silicon region produces a temperature difference between these regions. This temperature difference may form crystal defects such as slips in the substrate.

BRIEF SUMMARY OF THE INVENTION

A semiconductor device according to an aspect of the present invention comprises a first semiconductor layer formed in a first region of a semiconductor substrate with an insulating film interposed between the semiconductor substrate and the first semiconductor layer, and a plurality of second semiconductor layers formed in second regions of the semiconductor substrate.

BRIEF DESCRIPTION OF THE SEVERAL VIEWS OF THE DRAWING

FIG. 14 is a sectional view schematically showing the sections of an SOI region and a silicon region in the semiconductor device of the fourth embodiment;

FIG. 15 is a top view showing the arrangement of a semiconductor device according to the fifth embodiment of the present invention;

FIG. 16 is a sectional view showing the structure of a semiconductor device according to the sixth embodiment of the present invention; and FIG. 17 is a sectional view showing the structure of a semiconductor device according to the seventh embodiment of the present invention.

DETAILED DESCRIPTION OF THE INVENTION

Figure 1:
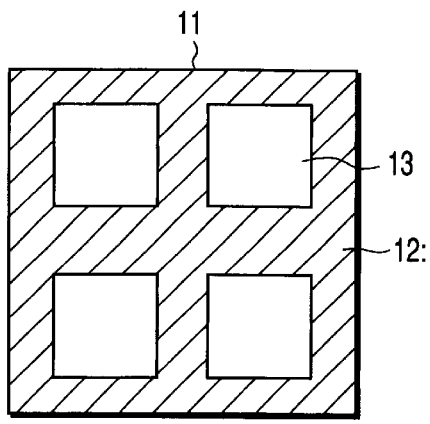
FIG. 1 is a top view showing the arrangement of a semiconductor device according to the first embodiment of the present invention.

Embodiments of the present invention will be described in detail below with reference to the accompanying drawings. In the following explanation, the same reference numerals denote the same parts throughout the views.

First Embodiment

A semiconductor device according to the first embodiment of the present invention will be described below. In this first embodiment, an SOI region is formed on a main surface of a semiconductor chip, and a plurality of island-like silicon regions are formed in this SOI region.

FIG. 1 is a top view showing the arrangement of the semiconductor device of the first embodiment.

As shown in FIG. 1, an SOI region 12 and four silicon regions 13 are formed on a semiconductor chip 11. The SOI region 12 is formed on a main surface of the semiconductor chip 11. This SOI region 12 has a sectional structure in which a semiconductor layer is formed on an insulating film on a semiconductor substrate. This semiconductor layer is, e.g., a silicon film.

The silicon regions 13 are a plurality of isolated islands surrounded by the SOI region 12. Referring to FIG. 1, the four silicon regions 13 having a predetermined size or smaller are formed in the SOI region 12. However, a plurality of other silicon regions can also be formed. The predetermined size and number of the silicon regions 13 are so set that no crystal defects such as slips are produced in the semiconductor chip 11 by annealing.

Analog circuits such as a digital/analog converter (A/D converter) and amplifier circuit are formed in one of the four silicon regions 13. In the remaining three silicon regions 13, semiconductor storage circuits, e.g., 8-Mbit DRAMs are formed. A logic circuit is formed in the SOI region 12.

In the semiconductor chip having this configuration, the plurality of silicon regions 13 are formed in the SOI region 12 on the semiconductor chip 11. Since the size of the individual silicon regions 13 can be decreased compared to a case in which one silicon region is formed, thermal stress produced in these silicon regions 13 when annealing is performed can be alleviated. This can reduce crystal defects such as slips produced in the semiconductor chip 11 in the annealing step.

Also, these silicon regions 13 are arranged to be symmetrical with respect to a certain straight line on the semiconductor chip 11. Preferably, the silicon regions 13 are arranged to be symmetrical with respect to a certain point on the semiconductor chip 11. Accordingly, thermal stress produced in these silicon regions 13 upon annealing can be appropriately dispersed on the semiconductor chip 11. This can reduce crystal defects such as slips produced in the semiconductor chip 11 in the annealing step.

Since the logic circuit is formed in the SOI region 12, the parasitic capacitance of wiring can be reduced. This facilitates increasing the operating speed of this logic circuit. Furthermore, the analog circuits are formed in the silicon region 13 isolated by the SOI region 12. This can prevent the propagation of noise from the logic circuit and the DRAMs to the analog circuits.

Figure 2:
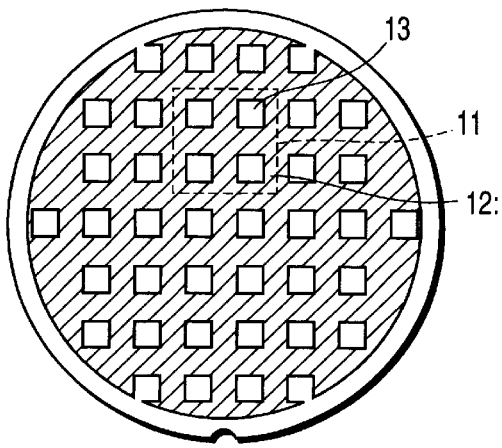
FIG. 2 is a top view of a wafer before the semiconductor device shown in FIG. 1 is diced.

FIG. 2 is a top view of a wafer before the semiconductor chip 11 shown in FIG. 1 is diced.

As shown in FIG. 2, an SOI region 12 is formed on the wafer (semiconductor substrate). In this SOI region 12, a plurality of silicon regions 13 having a predetermined size are arranged. The predetermined size and number of these silicon regions 13 are so set that no crystal defects such as slips are produced in the wafer by annealing. The semiconductor chip 11 shown in FIG. 1 is cut from the broken lines shown in FIG. 2.

Next, a method of fabricating the semiconductor device according to the first embodiment will be described.

First, two silicon wafers having 200-mm$\phi$ mirror surfaces are prepared. On the first wafer, a 100-nm thick oxide film is formed in a dry oxygen atmosphere. After that, this surface of the first wafer on which the oxide film is formed and the mirror surface of the second wafer are adhered, and the two wafers are bonded by annealing at 1,100° C.

Subsequently, one side of the bonded substrate is polished to reduce the thickness of a silicon film present on the oxide film to 100 nm. A photoresist film is formed on this silicon film, and a desired pattern is transferred onto the photoresist film by using an exposure mask. The resist film present on the internal oxide film to be removed in the later step is stripped, thereby forming a resist pattern. After that, an aqueous solution of potassium hydroxide (KOH) is used to etch the silicon film not covered with the resist pattern. In addition, the buried oxide film is removed by an aqueous solution of hydrogen fluoride (HF).

Next, selective epitaxial growth is performed to form a silicon epitaxial layer on the silicon film exposed by the removal of the oxide film. If necessary, the surface of this silicon epitaxial layer is polished by CMP.

By the above-mentioned fabrication method, a wafer on which 6 mm×6 mm silicon regions 13 were arranged at 10-mm pitches in the longitudinal and lateral directions in an SOI region 12 was formed as a practical example of this first embodiment. This wafer was cut to form a 20 mm×20 mm semiconductor chip. On this semiconductor chip, four 6 mm×6 mm silicon regions 13 were arranged. An A/D converter and an amplifier circuit were formed in one silicon region 13, and 8-Mbit DRAMs were formed in the three other silicon regions 13.

As a comparative example of this first embodiment, a wafer on which 12 mm×12 mm silicon regions were arranged at 20-mm pitches in the longitudinal and lateral directions in an SOI region 12 was formed. This wafer was cut to form a 20 mm×20 mm semiconductor chip. On this semiconductor chip, one 12 mm×12 mm silicon region was formed. An A/D converter, amplifier circuit, and 8-Mbit DRAM were formed in this silicon region.

The characteristics of the semiconductor chip 11 having the four silicon chips (6 mm×6 mm) were compared with the characteristics of a semi-conductor chip 11A having one silicon region (12 mm×12 mm), and the results were as follows. The S/N ratio of the semiconductor chip 11 was 30 dB, and that of the semiconductor chip 11A was 15 dB. That is, this characteristic of the semiconductor chip 11A was deteriorated by noise presumably produced by the formation of the A/D converter, amplifier circuit, and DRAM in one silicon region. Also, the leakage current characteristic of the semiconductor chip 11 was not deteriorated. However, the leakage current characteristic of the semiconductor chip 11A was deteriorated by slips probably produced in the annealing step (RTA step) in the element formation process.

Note that in the first embodiment, an SON region having the SON structure may be formed instead of the SOI region described earlier. Even when this SON region is formed, the same effects as when the SOI region is formed can be obtained. The SON region will be described in detail later in the seventh embodiment.

In this first embodiment as described above, even when a substrate is rapidly heated and cooled, it is possible to reduce the influence of a temperature difference produced by a difference between the heat absorption efficiencies of an SOI region or SON region and a silicon region on the substrate. This can prevent the generation of crystal defects in the substrate.

Second Embodiment

A semiconductor device according to the second embodiment of the present invention will be described below. In this second embodiment, an SOI region is formed on a main surface of a semiconductor chip, and a plurality of island-like silicon regions are formed to be surrounded by this SOI region. In addition, a silicon region is formed on an outerperipheral of the semiconductor chip.

Figure 3:
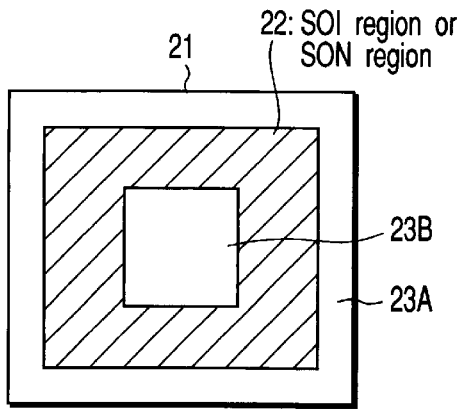
FIG. 3 is a top view showing the arrangement of a semiconductor device according to the second embodiment of the present invention.

FIG. 3 is a top view showing the arrangement of the semiconductor device of the second embodiment.

As shown in FIG. 3, an SOI region 22 and two silicon regions 23A and 23B are formed on a semiconductor chip 21. The silicon region 23A is formed to have a predetermined width on an outerperipheral of the semiconductor chip 21, so as to surround the SOI region 22. The silicon region 23B is an isolated island surrounded by the SOI region 22 and has a predetermined size or smaller. The predetermined width of the silicon region 23A and the predetermined size of the silicon region 23B are so set that no crystal defects such as slips are produced in the semiconductor chip 21 by annealing. The SOI region 22 has a sectional structure in which a semiconductor layer is formed on an insulating film on a semiconductor substrate. This semiconductor layer is, e.g., a silicon film.

In the silicon region 23A, an input/output circuit (I/O circuit) for exchanging signals with the outside is formed. In the silicon region 23B, a semiconductor storage circuit, e.g., an 8-Mbit DRAM is formed. A logic circuit is formed in the SOI region 22.

In the semiconductor chip having this configuration, the silicon region 23A is formed on the outerperipheral of the semiconductor chip 21, and the silicon region 23B is formed in the SOI region 22 surrounded by the silicon region 23A. Since the sizes of these silicon regions 23A and 23B can be decreased compared to a case in which one silicon region is formed, thermal stress produced in the silicon regions 23A and 23B when annealing is performed can be alleviated. This can reduce crystal defects such as slips produced in the semiconductor chip 21 in the annealing step.

Also, the logic circuit is formed in the SOI region 22, so the parasitic capacitance of wiring can be reduced. This facilitates increasing the operating speed of this logic circuit. Furthermore, since the I/O circuit is formed in the silicon region 23A, it is possible to prevent the application of high voltages to elements forming this I/O circuit. This can prevent electrostatic breakdown.

Figure 4:
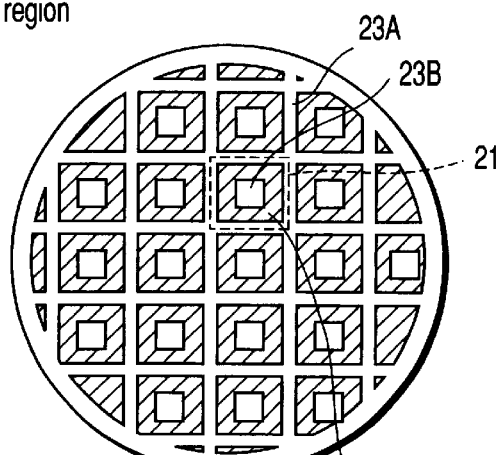
FIG. 4 is a top view of a wafer before the semiconductor device shown in FIG. 3 is diced.

FIG. 4 is a top view of a wafer before the semiconductor chip 21 shown in FIG. 3 is diced.

As shown in FIG. 4, SOI regions 22 is formed on the wafer (semiconductor substrate). In the SOI regions 22, a plurality of silicon regions 23B having a predetermined size are arranged. In addition, a silicon region 23A having a predetermined width is linearly formed to segment the SOI regions 22 in the longitudinal and lateral directions. The predetermined width of the silicon region 23A and the predetermined size of the silicon regions 23B are so set that no crystal defects such as slips are produced in the wafer by annealing. The semiconductor chip 21 shown in FIG. 3 is cut from the broken lines shown in FIG. 4.

As described above, the plurality of silicon regions 23B are formed in the SOI regions 22 on the wafer, and the linear silicon region 23A is formed to segment the SOI regions 22. Since the sizes of the individual silicon regions 23A and 23B can be decreased, thermal stress produced during annealing can be alleviated. This can reduce crystal defects such as slips produced in the wafer in the annealing step.

Note that a method of fabricating the semiconductor device according to the second embodiment is the same as the first embodiment described above, so a detailed explanation thereof will be omitted.

Next, semiconductor devices of modifications according to the second embodiment will be described.

Figure 5:
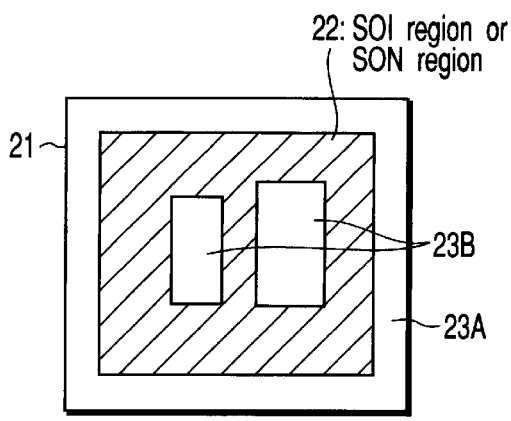
FIG. 5 is a top view showing the arrangement of a semiconductor device of the first modification according to the second embodiment.

FIG. 5 is a top view showing the arrangement of a semiconductor device of the first modification according to the second embodiment.

As shown in FIG. 5, an SOI region 22, a silicon region 23A, and two silicon regions 23B are formed on a semiconductor chip 21. The silicon region 23A is formed to have a predetermined width on an outerperipheral of the semiconductor chip 21, so as to surround the SOI region 22. The two silicon regions 23B are isolated islands surrounded by the SOI region 22 and have a predetermined size or smaller. The predetermined width of the silicon region 23A and the predetermined size of the silicon regions 23B are so set that no crystal defects such as slips are produced in the semiconductor chip 21 by annealing. The SOI region 22 has a sectional structure in which a semiconductor layer is formed on an insulating film on a semiconductor substrate. This semiconductor layer is, e.g., a silicon film.

In the silicon region 23A, an input/output circuit (I/O circuit) for exchanging signals with the outside is formed. Of the two silicon regions 23B, analog circuits, e.g., a digital/analog converter (A/D converter) and an amplifier circuit are formed in one silicon region 23B. In the other silicon region 23B, a semiconductor storage circuit, e.g., an 8-Mbit DRAM is formed. A logic circuit is formed in the SOI region 22.

In the semiconductor chip having this configuration, the silicon region 23A is formed on the outerperipheral of-the semiconductor chip 21, and the two silicon regions 23B are formed in the SOI region 22 surrounded by the silicon region 23A. Since the sizes of the individual silicon regions 23A and 23B can be decreased compared to a case in which one silicon n region is formed, thermal stress produced in these silicon regions 23A and 23B when annealing is performed can be alleviated. This can reduce crystal defects such as slips produced in the semiconductor chip 21 in the annealing step.

Also, the logic circuit is formed in the SOI region 22, so the parasitic capacitance of wiring can be reduced. This facilitates increasing the operating speed of this logic circuit. Furthermore, of the two silicon regions 23B isolated by the SOI region 22, the analog circuits are formed in one silicon region 23B, and the DRAM is formed in the other silicon region 23B. This can prevent the propagation of noise from the logic circuit and the DRAM to the analog circuits.

Note that in this modification, the two silicon regions 23B are formed. However, a plurality of other silicon regions can also be formed.

Figure 6:
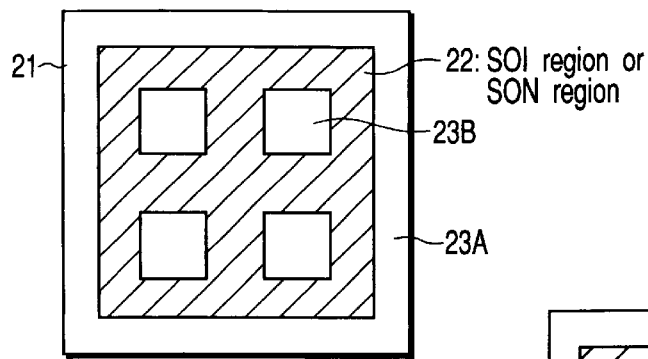
FIG. 6 is a top view showing the arrangement of a semiconductor device of the second modification according to the second embodiment.

FIG. 6 is a top view showing the arrangement of a semiconductor device of the second modification according to the second embodiment.

As shown in FIG. 6, an SOI region 22, a silicon region 23A, and four silicon regions 23B are formed on a semiconductor chip 21. The silicon region 23A is formed to have a predetermined width on an outerperipheral of the semiconductor chip 21, so as to surround the SOI region 22. The four silicon regions 23B are isolated islands surrounded by the SOI region 22 and have a predetermined size or smaller. The predetermined width of the silicon region 23A and the predetermined size of the silicon regions 23B are so set that no crystal defects such as slips are produced in the semiconductor chip 21 by annealing. The SOI region 22 has a sectional structure in which a semiconductor layer is formed on an insulating film on a semiconductor substrate. This semiconductor layer is, e.g., a silicon film.

In the silicon region 23A, an input/output circuit (I/O circuit) for exchanging signals with the outside is formed. Of the four silicon regions 23B, analog circuits, e.g., a digital/analog converter (A/D converter) and an amplifier circuit are formed in one silicon region 23B. In the three other silicon regions 23B, semiconductor storage circuits, e.g., 8-Mbit DRAMs are formed. A logic circuit is formed in the SOI region 22.

In the semiconductor chip having this configuration, the silicon region 23A is formed on the outerperipheral of the semiconductor chip 21, and the four silicon regions 23B are formed in the SOI region 22 surrounded by the silicon region 23A. Since the sizes of the individual silicon regions 23A and 23B can be decreased compared to a case in which one silicon region is formed, thermal stress produced in these silicon regions 23A and 23B when annealing is performed can be alleviated. This can reduce crystal defects such as slips produced in the semiconductor chip 21 in the annealing step.

Also, the logic circuit is formed in the SOI region 22, so the parasitic capacitance of wiring can be reduced. This facilitates increasing the operating speed of this logic circuit. Furthermore, of the four silicon regions 23B isolated by the SOI region 22, the analog circuits are formed in one silicon region 23B, and the DRAMs are formed in the three other silicon regions 23B. This can prevent the propagation of noise from the logic circuit and the DRAMs to the analog circuits.

Note that in this modification, the four silicon regions 23B are formed. However, a plurality of other silicon regions can also be formed.

In the second embodiment and its modification, an SON region having the SON structure may be formed instead of the SOI region described earlier. Even when this SON region is formed, the same effects as when the SOI region is formed can be obtained.

In this second embodiment and its modifications as described above, even when a substrate is rapidly heated and cooled, it is possible to reduce the influence of a temperature difference produced by a difference between the heat absorption efficiencies of an SOI region or SON region and a silicon region on the substrate. This can prevent the generation of crystal defects in the substrate.

Third Embodiment

A semiconductor device according to the third embodiment of the present invention will be described below. In this third embodiment, a silicon region is formed on a main surface of a semiconductor chip, and island-like SOI regions are formed to be surrounded by this silicon region.

Figure 7:
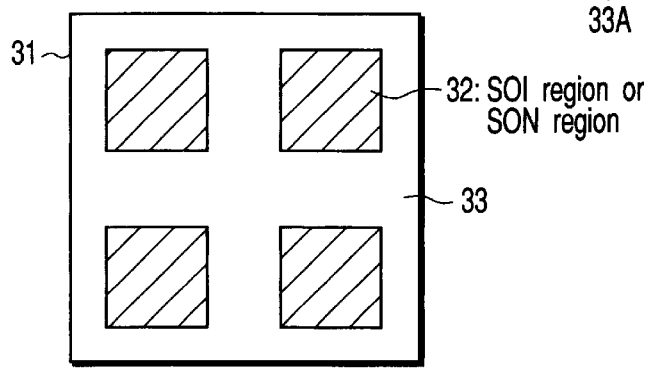
FIG. 7 is a top view showing the arrangement of a semiconductor device according to the third embodiment of the present invention.

FIG. 7 is a top view showing the arrangement of the semiconductor device of the third embodiment.

As shown in FIG. 7, four SOI regions 32 and a silicon region 33 are formed on a semiconductor chip 31. The silicon region 33 is formed on a main surface of the semiconductor chip 31. The SOI regions 32 are a plurality of isolated islands surrounded by the silicon region 33. Referring to FIG. 7, the four SOI regions 32 having a predetermined size or smaller are arranged in the silicon region 33. However, a plurality of other SOI regions can also be formed. The predetermined size of the SOI regions 32 is so set that no crystal defects such as slips are produced in the semiconductor chip 31 by annealing. Each SOI region 32 has a sectional structure in which a semiconductor layer is formed on an insulating film on a semiconductor substrate. This semiconductor layer is, e.g., a silicon film.

A semiconductor storage circuit, e.g., an 8-Mbit DRAM, an analog circuit, and a signal input/output circuit are formed in the silicon region 33. Logic circuits are formed in the four SOI regions 32.

In the semiconductor chip having this configuration, the plurality of SOI regions 32 are formed in the silicon region 33 on the semiconductor chip 31. Since the size of the individual SOI regions 32 can be decreased compared to a case in which one SOI region is formed, thermal stress produced in these SOI regions 32 when annealing is performed can be alleviated. This can reduce crystal defects such as slips produced in the semiconductor chip 31 in the annealing step.

Also, these SOI regions 32 are arranged to be symmetrical with respect to a certain straight line on the semiconductor chip 31. Preferably, the SOI regions 32 are arranged to be symmetrical with respect to a certain point on the semiconductor chip 31. Accordingly, thermal stress produced in these SOI regions 32 upon annealing can be appropriately dispersed on the semiconductor chip 31. This can reduce crystal defects such as slips produced in the semiconductor chip 31 in the annealing step.

Since the logic circuits are formed in the SOI regions 32, the parasitic capacitance of wiring can be reduced. This facilitates increasing the operating speed of these logic circuits.

Next, semiconductor devices according to modifications of this third embodiment will be described.

Figure 8:
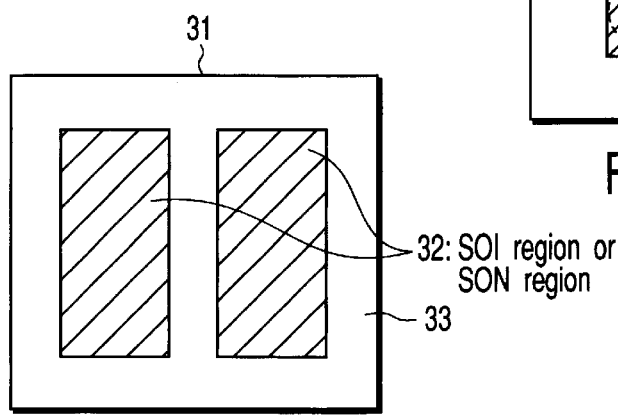
FIG. 8 is a top view showing the arrangement of a semiconductor device of the first modification according to the third embodiment.

FIG. 8 is a top view showing the arrangement of a semiconductor device according to the first modification of the third embodiment.

As shown in FIG. 8, two SOI regions 32 and a silicon region 33 are formed on a semiconductor chip 31. The SOI regions 32 are a plurality of isolated islands surrounded by the silicon region 33. Referring to FIG. 8, the two SOI regions 32 having a predetermined size or smaller are arranged in the silicon region 33. The predetermined size of these SOI regions 32 is so set that no crystal defects such as slips are produced in the semiconductor chip 31 by annealing. Each SOI region 32 has a sectional structure in which a semiconductor layer is formed on an insulating film on a semiconductor substrate. This semiconductor layer is, e.g., a silicon film.

A semiconductor storage circuit, e.g., an 8-Mbit DRAM is formed in the silicon region 33. Logic circuits are formed in the two SOI regions 32.

In the semiconductor chip having this configuration, similar to the above-mentioned semiconductor chip, the plurality of SOI regions 32 are formed in the silicon region 33 on the semiconductor chip 31. Since the size of the individual SOI regions 32 can be decreased compared to a case in which one SOI region is formed, thermal stress produced in these SOI regions 32 when annealing is performed can be alleviated. This can reduce crystal defects such as slips produced in the semiconductor chip 31 in the annealing step.

Also, since the logic circuits are formed in the SOI regions 32, the parasitic capacitance of wiring can be reduced. This facilitates increasing the operating speed of these logic circuits.

Figure 9:
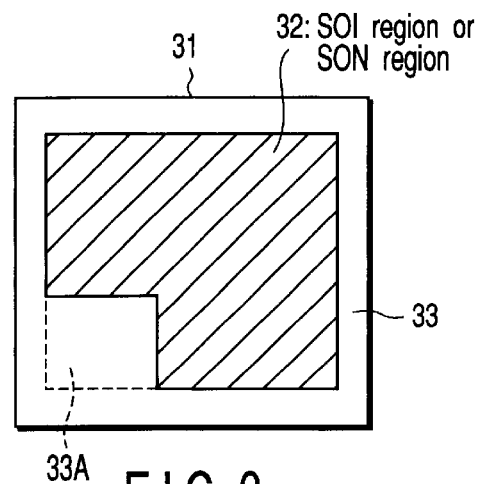
FIG. 9 is a top view showing the arrangement of a semiconductor device of the second modification according to the third embodiment.

FIG. 9 is a top view showing the arrangement of a semiconductor device according to the second modification of the third embodiment.

As shown in FIG. 9, an SOI region 32 and silicon regions 33 and 33A are formed on a semiconductor chip 31. The SOI region 32 is an isolated island surrounded by the silicon regions 33 and 33A and has a predetermined size or smaller. The predetermined size of this SOI region 32 is so set that no crystal defects such as slips are produced in the semiconductor chip 31 by annealing. This SOI region 32 has a sectional structure in which a semiconductor layer is formed on an insulating film on a semiconductor substrate. This semiconductor layer is, e.g., a silicon film.

The silicon region 33 is formed to have a predetermined width on an outerperipheral of the semiconductor chip 31. The silicon region 33A is formed between a corner of the SOI region 32 and the silicon region 33.

An input/output circuit for exchanging signals with the outside is formed in the silicon region 33. A semiconductor storage circuit, e.g., an 8-Mbit DRAM is formed in the silicon region 33A. A logic circuit is formed in the SOI region 32.

In the semiconductor chip having this configuration, the silicon regions 33 and 33A are formed on the outerperipheral of the semiconductor chip 31, and the SOI region 32 having a predetermined size is formed in a region surrounded by the silicon regions 33 and 33A. Accordingly, thermal stress produced when annealing is performed can be alleviated. This can reduce crystal defects such as slips produced in the semiconductor chip 31 in the annealing step.

Also, since the logic circuit is formed in the SOI region 32, the parasitic capacitance of wiring can be reduced. This facilitates increasing the operating speed of this logic circuit.

Note that in the third embodiment and its modification, an SON region having the SON structure may be formed instead of the SOI region described earlier. Even when this SON region is formed, the same effects as when the SOI region is formed can be obtained.

In this third embodiment and its modifications as described above, even when a substrate is rapidly heated and cooled, it is possible to reduce the influence of a temperature difference produced by a difference between the heat absorption efficiencies of an SOI region or SON region and a silicon region on the substrate. This can prevent the generation of crystal defects in the substrate.

Fourth Embodiment

A semiconductor device according to the fourth embodiment of the present invention will be described below. In this fourth embodiment, a silicon region is formed on a main surface of a semiconductor chip, and a plurality of island-like SOI regions are formed to be surrounded by this silicon region. In addition, a method of solving the problem of selection breakdown by which, in a selective epitaxial growth step for forming a silicon region, silicon is deposited on an SOI region other than the silicon region will be explained.

Figure 10:
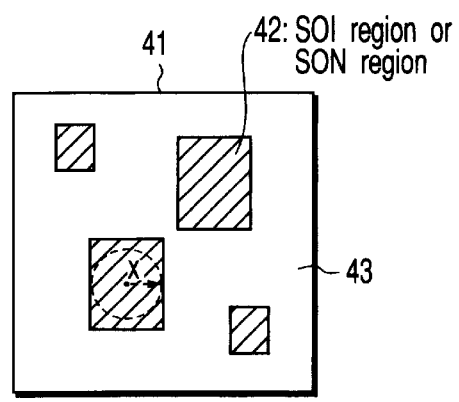
FIG. 10 is a top view showing the arrangement of a semiconductor device according to the fourth embodiment of the present invention.

FIG. 10 is a top view showing the arrangement of the semiconductor device of the fourth embodiment.

As shown in FIG. 10, four isolated SOI regions 42 and a silicon region 43 are formed on a semiconductor chip 41. The silicon region 43 is formed on a main surface of the semiconductor chip 41. The SOI regions 42 are a plurality of isolated islands surrounded by the silicon region 43. Referring to FIG. 10, the four SOI regions 42 having a predetermined size or smaller are arranged in the silicon region 43. However, a plurality of other SOI regions can also be formed. The predetermined size of these SOI regions 42 is so set that no crystal defects such as slips are produced in the semiconductor chip 41 by annealing. Each SOI region 42 has a sectional structure in which a semiconductor layer is formed on an insulating film on a semiconductor substrate. This semiconductor layer is, e.g., a silicon film.

In the semiconductor chip 41 having this configuration, the plurality of island-like SOI regions 42 are formed in the silicon region 43 on the semiconductor chip 41. Since the size of the individual SOI regions 42 can be decreased compared to a case in which one SOI region is formed, thermal stress produced in these SOI regions 42 when annealing is performed can be alleviated. This can reduce crystal defects such as slips produced in the semiconductor chip 41 in the annealing step.

When the SOI regions and the silicon region are to be formed on the semiconductor chip, selective epitaxial growth is used in the formation of the silicon region. When this selective epitaxial growth method is used, the problem of selection breakdown arises by which silicon is deposited on an insulating film, such as an oxide film or nitride film, on the SOI regions. A semiconductor device which has solved this problem of selection breakdown will be explained below. A fabrication method using selective epitaxial growth will be described first, and then a method of preventing selection breakdown will be explained.

First, a native oxide film present on the surface of a silicon substrate is removed by pre-processing using an aqueous solution of hydrogen fluoride. After that, the wafer is loaded into an epitaxial growth apparatus. Annealing is performed in a non-oxidizing atmosphere, e.g., a hydrogen atmosphere. This annealing is for cleaning the silicon substrate surface before epitaxial growth, and the silicon oxide film on the substrate surface is completely removed in this stage. Accordingly, this annealing is desirably performed in a non-oxidizing atmosphere such as a hydrogen atmosphere. The annealing conditions are, e.g., 1,000° C., 10 Torr, and 3 min.

Subsequently, silicon epitaxial growth is performed. $SiH_2Cl_2$(DCS) and $HCl/H_2$ are used as a growth gas/a carrier gas. When a silicon oxide film or a silicon nitride film is patterned on the silicon substrate, an epitaxial silicon film can be selectively formed only on the silicon substrate by the use of DCS and HCl. This epitaxial growth is performed at a temperature of 900° C. or more.

The results of examination of selection breakdown when the aforementioned selective epitaxial growth was performed will be described below.

Figure 11:
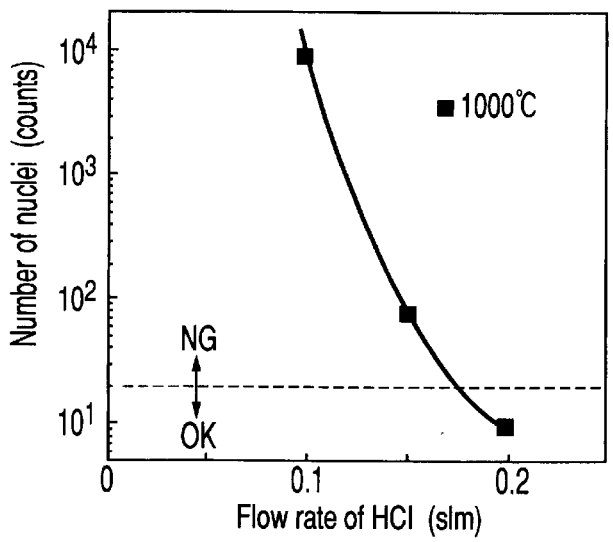
FIG. 11 is a graph showing the dependence of the number of nuclei on the flow rate of hydrochloric acid and on the epitaxial growth temperature in the semiconductor device of the fourth embodiment.
Figure 13:
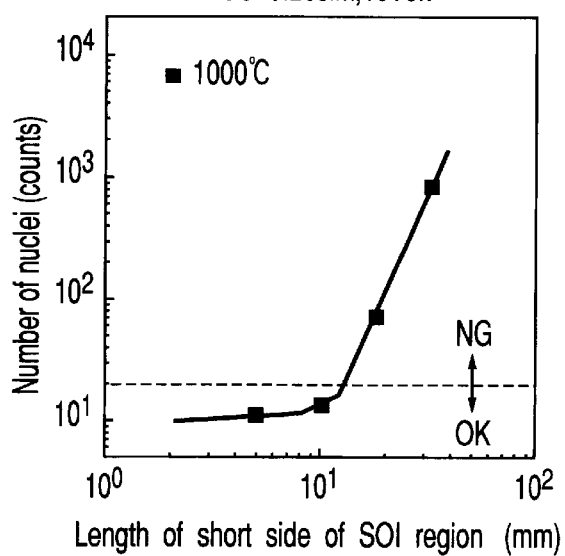
FIG. 13 is a graph showing the dependence of the number of nuclei on the shape of an SOI region in the semiconductor device of the fourth embodiment.
Figure 12:
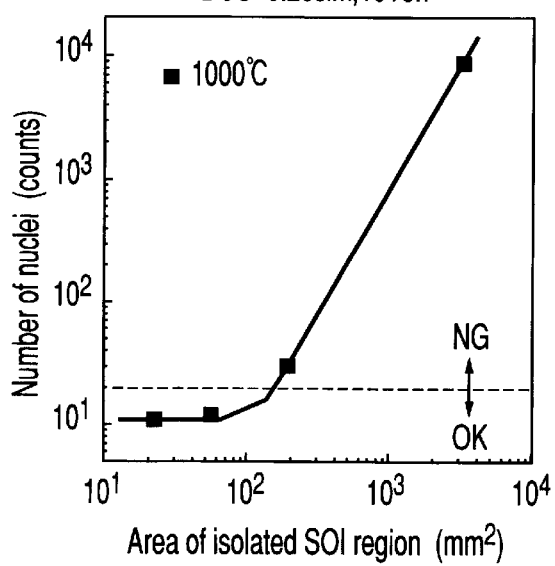
FIG. 12 is a graph showing the dependence of the number of nuclei on the size of an SOI region when selectivity is low in the semiconductor device of the fourth embodiment.

FIGS. 11, 12, and 13 are graphs obtained by monitoring the number of silicon nuclei produced on an SOI region after epitaxial growth. The ordinate indicates the number of silicon nuclei: the larger the number of silicon nuclei, the larger the selection breakdown. Note that the surface of the SOI region is a silicon oxide film or a silicon nitride film.

Generally, selective epitaxial growth can be performed on both a silicon oxide film and a silicon nitride film. As to selectivity, however, selection breakdown occurs more easily when a silicon nitride film is used. Therefore, the experiments were conducted under severer conditions using a silicon nitride film.

First, the selectivity was evaluated with respect to a main surface of a wafer covered with a silicon nitride film. FIG. 11 shows the dependence of the number of silicon nuclei on the flow rate of hydrochloric acid. FIG. 11 indicates that the smaller the hydrochloric acid flow rate, the more largely the selectivity suffers.

FIG. 12 shows the dependence of the number of silicon nuclei on the size of an SOI region when the selectivity was low. FIG. 12 demonstrates that a given selectivity can be assured (does not break down) when the area of an isolated SOI region is small. Note that the shape of this SOI region was a square.

FIG. 13 shows the dependence of the number of silicon nuclei on the shape of an SOI region. The shape of the SOI region was a rectangle, and its area was fixed. FIG. 13 shows a change in the number of silicon nuclei when the length of the short side of this rectangle was changed. FIG. 13 reveals that even when the area of the SOI region is fixed, a given selectivity can be ensured by decreasing the length of the short side of the rectangle. That is, a desired selectivity can be ensured for a large SOI area by shortening the side of the SOI region. When the length of the short side of a rectangular SOI region is 10 mm or less, the number of silicon nuclei is equal to or smaller than the permissible number. By taking this into account, consider a square SOI region of 10 mm side. The distance from the center (the intersection of diagonal lines) to the edge of the SOI region is 5 mm. Accordingly, if at least a portion of a silicon region formed by epitaxial growth is within the range of a radius of 5 mm from a certain point on the SOI region, drop in selectivity in selective epitaxial growth can be suppressed.

This phenomenon in which drop in selectivity in selective epitaxial growth can be suppressed is presumably brought about by the following reason. FIG. 14 is a view schematically showing the sections of the SOI region 42 and the silicon region 43 in the semiconductor chip 41.

As shown in FIG. 14, a silicon film 46 is formed on a silicon substrate 44 with an insulating film 45 interposed between the silicon substrate 44 and the silicon film 46. On the silicon film 46, a silicon nitride film 47 having a hole 47A is formed. In the hole 47A of the silicon nitride film 47, silicon 48 currently being epitaxially grown is deposited on the silicon substrate 44.

In this state shown in FIG. 14, a silicon nucleus 49A deposited on the silicon nitride film 47 (on the SOI region) by selective epitaxial growth moves to the hole (silicon region) 47A and is absorbed by the silicon 48, if the distance from the hole 47A is equal to or smaller than a predetermined distance X. On the other hand, a silicon nucleus 49B at a distance Y longer than X from the hole 47A is hardly absorbed by the silicon 48, even when the silicon nucleus 49B moves toward the hole 47A, because the distance from the hole 47A is long. So, the silicon nucleus 49B stays and grows on the silicon nitride film 47. Poor selectivity is caused by the silicon nucleus 49B.

In the fourth embodiment as described above, even when a substrate is rapidly heated and cooled, it is possible to reduce the influence of a temperature difference produced by a difference between the heat absorption efficiencies of an SOI region and a silicon region on the substrate. This can prevent the generation of crystal defects in the substrate.

In addition, drop in selectivity of selective epitaxial growth can be suppressed by forming at least a portion of an epitaxial silicon region within the predetermined distance X (5 mm) from a certain point on the SOI region.

Note that in this embodiment, a plurality of SOI regions are formed. However, even when one SOI region is formed, drop in selectivity of selective epitaxial growth can be suppressed by forming at least a portion of an epitaxial silicon region within the predetermined distance X (5 mm) from any point on the SOI region.

In the fourth embodiment, an SON region having the SON structure may be formed instead of the SOI region described earlier. Even when this SON region is formed, the same effects as when the SOI region is formed can be obtained.

Fifth Embodiment

A semiconductor device according to the fifth embodiment of the present invention will be described below. In this fifth embodiment, an SOI region is formed on a main surface of a semiconductor chip, and a plurality of silicon regions are formed to be surrounded by the SOI region. In addition, a method of solving the problem of selection breakdown by which, in a selective epitaxial growth step for forming a silicon region, silicon is deposited on an SOI region other than the silicon region will be explained.

FIG. 15 is a top view showing the arrangement of the semiconductor device of the fifth embodiment.

As shown in FIG. 15, an SOI region 52 and four isolated silicon regions 53 are formed on a semiconductor chip 51. The silicon region 52 is formed on a main surface of the semiconductor chip 51. The SOI region 52 has a sectional structure in which a semiconductor layer is formed on an insulating film on a semiconductor substrate. This semiconductor layer is, e.g., a silicon film.

The silicon regions 53 are a plurality of isolated islands surrounded by the SOI region 52. Referring to FIG. 15, the four silicon regions 53 having a predetermined size or smaller are arranged in the SOI region 52. However, a plurality of other silicon regions can also be formed. The predetermined size of these silicon regions 53 is so set that no crystal defects such as slips are produced in the semiconductor chip 51 by annealing.

In the semiconductor chip 51 having this configuration, the plurality of island-like silicon regions 53 are formed in the SOI region 52 on the semiconductor chip 51. Since the sizes of the individual silicon regions 53 can be decreased compared to a case in which one silicon region is formed, thermal stress produced in these silicon regions 53 when annealing is performed can be alleviated. This can reduce crystal defects such as slips produced in the semiconductor chip 51 in the annealing step.

In addition, on the basis of the countermeasure against selection breakdown described in the above fourth embodiment, at least a portion of the silicon region 53 is formed within a predetermined distance X (5 mm) from a certain point on the SOI region 52. Consequently, a drop in selectivity in selective epitaxial growth can be suppressed.

Note that in this embodiment, a plurality of silicon regions are formed. However, even when one silicon region is formed, a drop in selectivity in selective epitaxial growth can be suppressed by forming at least a portion of an epitaxial silicon region within the predetermined distance X (5 mm) from any point on the SOI region.

This arrangement for suppressing a drop in selectivity in selective epitaxial growth is similarly applicable to any of the first to third embodiments described previously.

Note that in the fifth embodiment, an SON region having the SON structure may be formed instead of the SOI region described earlier. Even when this SON region is formed, the same effects as when the SOI region is formed can be obtained.

Sixth Embodiment

A semiconductor device of the sixth embodiment of the present invention will be described below. In this sixth embodiment, an example in which elements are respectively formed in the silicon region and the SOI region in the semiconductor device according to each of the first to fifth embodiments will be explained with reference to a sectional view.

FIG. 16 is a sectional view showing the structure of the semiconductor device of the sixth embodiment.

As shown in FIG. 16, an SOI structure is formed in a portion of a silicon substrate 60. That is, an insulating layer 61 is formed on one region of the silicon substrate 60, and a semiconductor layer 62 is formed on this insulating layer 61. The insulating layer 61 is, e.g., a silicon oxide film and will be referred to as a BOX (Buried Oxide) layer hereinafter. The semiconductor layer 62 is, e.g., a silicon layer and will be referred to as an SOI layer hereinafter. A semiconductor layer, e.g., a silicon layer 63 is formed on the other region of the silicon substrate 60.

As described above, the region in which the SOI structure including the BOX layer 61 and the SOI layer 62 is formed on the silicon substrate 60 is an SOI region. The region in which the silicon layer 63 is formed on the silicon substrate 60 is a silicon region. The SOI region 62 is electrically isolated from the silicon substrate 60 by the BOX layer 61. The silicon layer 63 is electrically connected to the silicon substrate 60.

In these silicon region and SOI region, element regions surrounded by element isolation regions STI and an element isolation region 64 are formed. Note that the element isolation region 64 in the SOI region and the element isolation region STI in the boundary between the silicon region and the SOI region are so formed as to reach at least the BOX layer 61. Note also that the element isolation region 64 in the SOI region is formed by, e.g., a well-known LOCOS (Local Oxidation of Silicon) process. The element isolation region STI in the boundary between the silicon region and the SOI region and the element isolation region STI in the silicon region are formed by forming trenches and burying an insulating film in these trenches.

A MOS transistor TR1 is formed in the element region in the silicon region. A MOS transistor TR2 is formed in the element region in the SOI region. Each of these MOS transistors TR1 and TR2 has a source region, drain region, and gate electrode. A source region 65A and a drain region 66A of the MOS transistor TR1 are formed apart from each other on the surface of the silicon layer 63. A gate electrode 67A of this MOS transistor TR1 is formed on the silicon layer 63 between the source region 65A and the drain region 66A with a gate insulating film 68A interposed between the silicon layer 63 and the gate electrode 67A.

A source region 65B and a drain region 66B of the MOS transistor TR2 are formed apart from each other on the surface of the SOI layer 62. A gate electrode 67B of this MOS transistor TR2 is formed on the SOI layer 62 between the source region 65B and the drain region 66B with a gate insulating film 68B interposed between the SOI layer 62 and the gate electrode 67B. The bottom portions of the source region 65B and the drain region 66B of the MOS transistor TR2 reach the BOX layer 61.

In the semiconductor device of this sixth embodiment, as described in the first to fifth embodiments, thermal stress produced in the silicon region and the SOI region can be alleviated. Consequently, crystal defects such as slips produced in the semiconductor device can be reduced.

Seventh Embodiment

A semiconductor device of the seventh embodiment of the present invention will be described below. In this seventh embodiment, a semiconductor device having an SON (Silicon On Nothing) structure will be explained. In this SON structure, a silicon layer is formed on a cavity region. Details of the SON structure will be described later. In the above sixth embodiment, an element is formed in the SOI region having the SOI structure. In this seventh embodiment, an element is formed in an SON region having the SON structure, instead of the SOI region.

FIG. 17 is a sectional view showing the structure of the semiconductor device of the seventh embodiment.

As shown in FIG. 17, this semiconductor device has a silicon region and an SON region. In these silicon region and SON region, element regions electrically isolated from each other by element isolation regions STI are formed. In these element regions, MOS transistors TR1 and TR3 are formed.

The structure of the silicon region is the same as in the sixth embodiment, so a detailed description thereof will be omitted. In this embodiment, only the SON region will be explained.

As shown in FIG. 17, an SON structure is formed in a portion of a silicon substrate 60. That is, a cavity region 71 is formed on a partial region of this silicon substrate 60. A semiconductor layer 72 is formed on the silicon substrate 60 with this cavity region 71 interposed between the silicon substrate 60 and the semiconductor layer 72. The semiconductor layer 72 is, e.g., a silicon layer and will be referred to as an SON layer hereinafter. The region in which the SON structure including the cavity region 71 and the SON layer 72 is formed on the silicon substrate 60 is an SON region. The SON layer 72 is electrically isolated from the silicon substrate 60 by the cavity region 71. Accordingly, it is possible to obtain the same effect as the SOI structure having the BOX layer 61 between the silicon substrate 60 and the SOI layer 62 as explained in the sixth embodiment.

In the SON region, an element region surrounded by an element isolation region STI and an element isolation region 73 is formed. This element isolation region 73 in the SON region reaches the silicon substrate 60. Note that the element isolation region 73 is formed by fabrication steps different from fabrication steps of forming an element isolation region STI in the silicon region and an element isolation region STI in the boundary between the silicon region and the SON region.

In the element region formed in the SON region, the MOS transistor TR3 is formed. This MOS transistor TR3 has a source region, drain region, and gate electrode. A source region 74B and a drain region 75B of the MOS transistor TR3 reach the cavity region 71. A gate electrode 76B of this MOS transistor TR3 is formed on the SON layer 72 between the source region 74B and the drain region 75B with a gate insulating film 77B interposed between the SON layer 72 and the gate electrode 76B. The MOS transistor TR1 formed in the element region in the silicon region has the same arrangement as in the sixth embodiment, so a detailed description thereof will be omitted.

As described above, even a semiconductor device having an SON structure in a partial region of a silicon substrate can achieve the same effects as explained in the first to fifth embodiments.

In the semiconductor device of this seventh embodiment, as described in the sixth embodiment, thermal stress produced in the silicon region and the SON region can be alleviated. Consequently, crystal defects such as slips produced in the semiconductor device can be reduced.

Also, the above-mentioned embodiments can be practiced singly or in the form of an appropriate combination.

Furthermore, each of the above embodiments includes inventions in various stages. So, these inventions in various stages can be extracted by properly combining a plurality of components disclosed in each embodiment.

As described above, each embodiment of the present invention can provide a semiconductor device capable of reducing the influence of a temperature difference produced by a difference between the thermal absorption efficiencies of an SOI region and a silicon region on a substrate, even when the substrate is rapidly heated and cooled, thereby preventing the generation of crystal defects in the substrate.

Additional advantages and modifications will readily occur to those skilled in the art. Therefore, the invention in its broader aspects is not limited to the specific details and representative embodiments shown and described herein. Accordingly, various modifications may be made without departing from the spirit and scope of the general inventive concept as defined by the appended claims and their equivalents.

What is claimed is:

1. A semiconductor device comprising:
   a semiconductor substrate having a first region and second regions;
   a first semiconductor layer formed in said first region of said semiconductor substrate with one of an insulating film and a cavity interposed between said semiconductor substrate and said first semiconductor layer; and
   a plurality of second semiconductor layers formed in said second regions of said semiconductor substrate, each second semiconductor layer of said plurality of second semiconductor layers being surrounded by said first semiconductor layer, and said plurality of second semiconductor layers being arranged to be symmetrical with respect to a point on said semiconductor substrate.

2. A semiconductor device according to claim 1, wherein at least a portion of said plurality of second semiconductor layers is formed within the range of a radius of 5 mm from a certain point on said first semiconductor layer.

3. A semiconductor device according to claim 1, wherein a logic circuit is formed in said first semiconductor layer, and at least one of a storage element, analog element, and signal input/output circuit is formed in said plurality of second semiconductor layers.

4. A semiconductor device according to claim 1, wherein one of said plurality of second semiconductor layers surrounds said first semiconductor layer.

5. A semiconductor device according to claim 1, wherein said plurality of second semiconductor layers are arranged to be symmetrical with respect to a certain straight line on said semiconductor substrate.

6. A semiconductor device in which a plurality of semiconductor devices according to claim 1 are laid out.

7. A semiconductor device according to claim 1, wherein one of said plurality of second semiconductor layers is formed on an outerperipheral of said semiconductor substrate.

8. A semiconductor device in which a plurality of semiconductor devices according to claim 7 are laid out.

9. A semiconductor device according to claim 1, wherein the sum of the areas of said plurality of second semiconductor layers is larger than the area of said first semiconductor layer.

10. A semiconductor device according to claim 1, wherein said plurality of second semiconductor layers are deposited by epitaxial growth.

11. A semiconductor device according to claim 1, wherein said insulating film is interposed between said semiconductor substrate and said first semiconductor layer.

12. A semiconductor device according to claim 1, wherein said cavity is interposed between said semiconductor substrate and said first semiconductor layer.

13. A semiconductor device according to claim 1, wherein said first semiconductor layer includes a logic circuit, at least one second semiconductor layer of said plurality of second semiconductor layers includes a storage element, and at least one remaining second semiconductor layer of said plurality of second semiconductor layers includes an analog element.

14. A semiconductor device according to claim 13, wherein said storage element includes a dynamic random access memory (DRAM).

15. A semiconductor device according to claim 13, wherein said analog element includes a digital/analog converter.

16. A semiconductor device according to claim 13, wherein said analog element includes an amplifier circuit.

17. A semiconductor device according to claims 13, wherein said storage element includes a dynamic random access memory (DRAM), and said analog element includes one of a digital/analog converter and an amplifier circuit.

18. A semiconductor device comprising:
    a semiconductor substrate having a first region and second regions;
    a first semiconductor layer formed in said first region of said semiconductor substrate with one of an insulating film and a cavity interposed between said semiconductor substrate and said first semiconductor layer; and
    a plurality of second semiconductor layers formed in said second regions of said semiconductor substrate, each second semiconductor layer of said plurality of second semiconductor layers being surrounded by said first semiconductor layer, and said plurality of second semiconductor layers being arranged to be symmetrical with respect to a straight line on said semiconductor substrate.

19. A semiconductor device according to claim 18, wherein said insulating film is interposed between said semiconductor substrate and said first semiconductor layer.

20. A semiconductor device according to claim 18, wherein said cavity is interposed between said semiconductor substrate and said first semiconductor layer.

21. A semiconductor device according to claim 18, wherein said first semiconductor layer includes a logic circuit, at least one second semiconductor layer of said plurality of second semiconductor layers includes a storage element, and at least one remaining second semiconductor layer of said plurality of second semiconductor layers includes an analog element.

22. A semiconductor device according to claim 21, wherein said storage element includes a dynamic random access memory (DRAM).

23. A semiconductor device according to claim 21, wherein said analog element includes a digital/analog converter.

24. A semiconductor device according to claim 21, wherein said analog element includes an amplifier circuit.

25. A semiconductor device according to claim 21, wherein said storage element includes a dynamic random access memory (DRAM), and said analog element includes one of a digital/analog converter and an amplifier circuit.

26. A semiconductor device according to claim 18, wherein a sum of surface areas of said plurality of second semiconductor layers is larger than a surface area of said first semiconductor layer.

27. A semiconductor device according to claim 18, wherein said plurality of second semiconductor layers are deposited by epitaxial growth.

28. A semiconductor device comprising:
   a semiconductor substrate having a first region and second regions;
   a first semiconductor layer formed in said first region of said semiconductor substrate with one of an insulating film and a cavity interposed between said semiconductor substrate and said first semiconductor layer, a logic circuit being formed in said first semiconductor layer; and
   a plurality of second semiconductor layers formed in said second regions of said semiconductor substrate, each second semiconductor layer of said plurality of second semiconductor layers being surrounded by said first semiconductor layer, a storage element being formed in at least one second semiconductor layer of said plurality of second semiconductor layers, and an analog element being formed in at least one remaining second semiconductor layer of said plurality of second semiconductor layers.

29. A semiconductor device according to claim 28, wherein said insulating film is interposed between said semiconductor substrate and said first semiconductor layer.

30. A semiconductor device according to claim 28, wherein said cavity is interposed between said semiconductor substrate and said first semiconductor layer.

31. A semiconductor device according to claim 28, wherein said storage element includes a dynamic random access memory (DRAM).

32. A semiconductor device according to claim 28, wherein said analog element includes a digital/analog converter.

33. A semiconductor device according to claim 28, wherein said analog element includes an amplifier circuit.

34. A semiconductor device according to claim 28, wherein said storage element includes a dynamic random access memory (DRAM), and said analog element includes one of a digital/analog converter and an amplifier circuit.

35. A semiconductor device according to claim 28, wherein a sum of surface areas of said plurality of second semiconductor layers is larger than a surface area of said first semiconductor layer.

36. A semiconductor device according to claim 28, wherein said plurality of second semiconductor layers are deposited by epitaxial growth.

* * * * *